United States Patent [19]

Machida

[11] Patent Number: 5,352,981
[45] Date of Patent: Oct. 4, 1994

[54] HIGH-RESOLUTION IMAGE RECONSTRUCTION METHOD FOR MRI

[75] Inventor: Yoshio Machida, Tochigi, Japan

[73] Assignee: Kabushiki Kaisha Toshiba, Kawasaki, Japan

[21] Appl. No.: 981,760

[22] Filed: Nov. 25, 1992

[30] Foreign Application Priority Data

Nov. 27, 1991 [JP] Japan .................................. 3-312623

[51] Int. Cl.$^5$ ............................................. G01R 33/00
[52] U.S. Cl. .................................................. 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,736,160 | 4/1988 | Sano et al. | 324/312 |
| 4,767,991 | 8/1988 | Rzedzian | 324/312 |
| 4,896,111 | 1/1990 | Machida et al. | 324/309 |
| 4,908,573 | 3/1990 | Kaufman et al. | 324/309 |

*Primary Examiner*—Michael J. Tokar
*Attorney, Agent, or Firm*—Limbach & Limbach

[57] ABSTRACT

In an image reconstruction method for magnetic resonance imaging, an object to be imaged is reconstructed based on Fourier imaging. First, there specified is a spatial resolution smaller than a further spatial resolution under a Nyquist condition derived from the Nyquist theorem. Then, a transformation matrix according to the specified spatial resolution is calculated and an inverse transformation matrix of the calculated transformation matrix is calculated. Then, discrete magnetic resonance signals from the object is collected in accordance with the Fourier imaging. And, discrete oblique Fourier transformation(DOFT) using the inverse transformation matrix is performed on the collected discrete magnetic resonance signals.

17 Claims, 6 Drawing Sheets

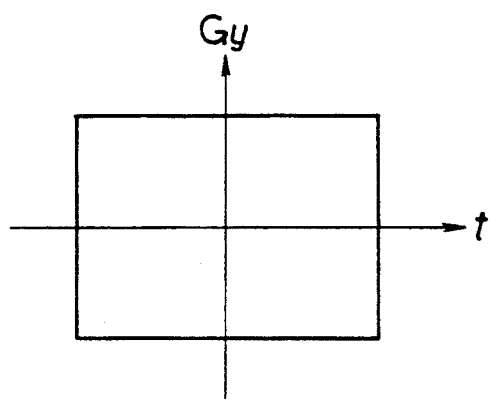
F I G. 8A
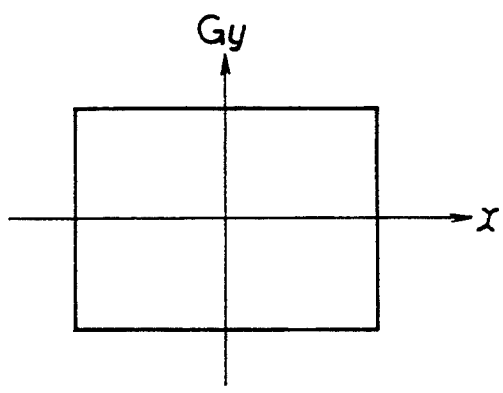
F I G. 8B
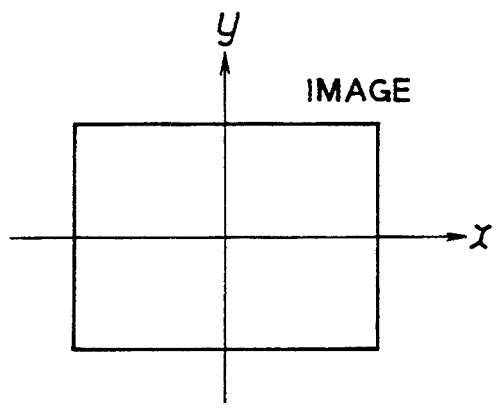
F I G. 8C

HIGH-RESOLUTION IMAGE RECONSTRUCTION METHOD FOR MRI

BACKGROUND OF THE INVENTION

The present invention relates to an image reconstruction algorithm for magnetic resonance imaging(MRI). More particularly, this invention is concerned with a high-resolution image reconstruction method for MRI that improves resolution under a given gradient field strength.

Current main streams of image reconstruction methods for MRI include an n-dimensional (n=2, 3, ...) Fourier transformation method, and a back projection method that corresponds to polar coordinate expression of the Fourier transformation. These methods are all based on Fourier transformation.

According to the Nyquist's theorem, a frequency resolution $\Delta f_O = 1/T_x$ is attained during an observation time $T_x$. A "Nyquist spatial resolution" $\Delta X_O$ corresponding to the frequency resolution $\Delta f_O$ is calculated using a gradient field strength $G_x$ [T/m]. When a Larmor constant $\gamma$ is used to demonstrate the relation between the resolutions, $$1/T_x = (\gamma \cdot G_x/2\pi) \cdot \Delta X_O$$

is provided. $T_x = N \cdot \Delta t$ is assigned to this expression. Then, when the resultant expression is simplified, $$\gamma \cdot G_x \cdot \Delta X_O \cdot \Delta t = 2\pi/N$$

is provided, which is referred to as a "Nyquist condition".

To increase a spatial resolution $\Delta X$ under the Nyquist conditions, a $G_x$ or $T_x$ value, and a size of an applied gradient field (product of strength $G_x$ by time $T_x$) must be increased. However, a gradient field strength applicable during a given echo time TE has a limit specific to individual hardware.

Therefore, when a discrete Fourier transformation(DFT) reconstruction algorithm based on an orthogonal transformation is adopted, if an attempt is made to improve resolution, a gradient coil, a power supply, and other hardware must be renovated to increase the gradient field strength (the resolution will improve in proportion to the gradient field strength). No other means is available.

SUMMARY OF THE INVENTION

Accordingly, it is an object of the present invention to provide a high-resolution image reconstruction method for MRI that improves resolution without causing a necessity of hardware renovation.

Another object of the present invention is to avoid artifacts due to aliasing.

Still another object of the present invention is to be able to reconstruct an image if the size of an object is unknown.

These and other objects can be achieved according to the present invention, in one aspect by providing, a high-resolution image reconstruction method, in which an object to be imaged is reconstructed based on Fourier imaging, the method comprising steps of: specifying a spatial resolution smaller than a further spatial resolution under a Nyquist condition derived from a Nyquist theorem; calculating a transformation matrix according to the specified spatial resolution; calculating an inverse transformation matrix of the calculated transformation matrix; collecting discrete magnetic resonance signals from said object in accordance with the Fourier imaging; and performing discrete oblique Fourier transformation using the inverse transformation matrix on the collected discrete magnetic resonance signals.

BRIEF DESCRIPTION OF THE DRAWINGS

The accompanying drawings which are incorporated in and constitute a part of this specification, illustrate embodiments of the present invention and, together with the description, serve to explain the principles of the present invention; in which. In the drawings:

FIGS. 8A, 8B, and 8C show echo data acquired with a 2DFT pulse sequence, data obtained by performing DOFT on the data of FIG. 8A in the first direction t, and an image obtained by performing DOFT on the data of FIG. 8B in the second direction $G_y$.

DESCRIPTION OF THE PREFERRED EMBODIMENTS

Prior to explanation of embodiments of the present invention, the principle of an image reconstruction method will now be described. The principle will be developed here from the concept of widely-known discrete orthogonal transformation to that of discrete oblique transformation in the field of Fourier imaging.

First, the discrete orthogonal transformation will be explained.

Figure 1:
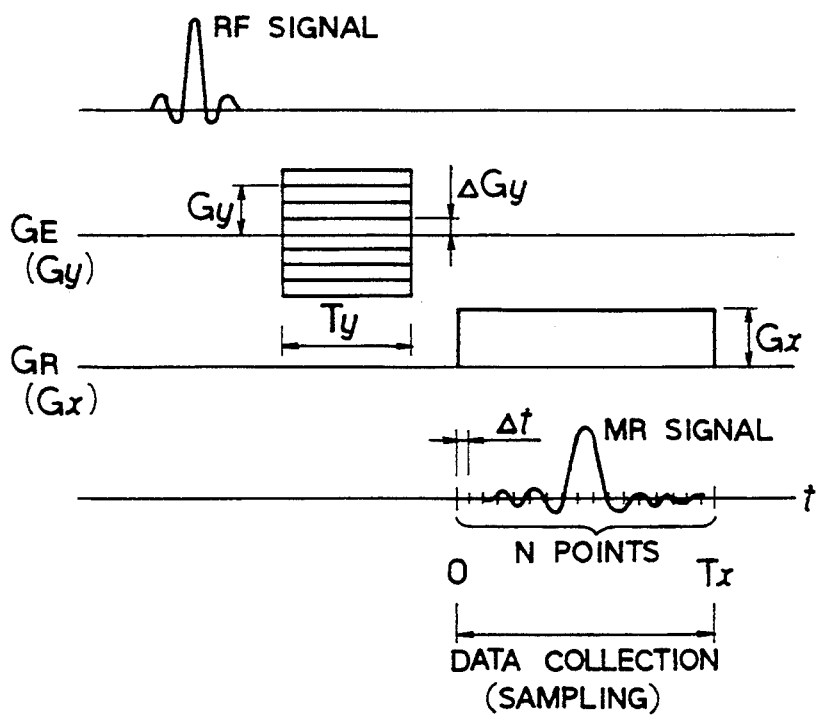
FIG. 1 shows a pulse sequence for 2DFT in order to explain principle of the present invention.

FIG. 1 shows a pulse sequence for two-dimensional Fourier transformation (2DFT) method that is usually adopted in MRI. In FIG. 1, RF denotes a selective excitation pulse. x and y denote directions of coordinate axes. $G_x$ and $G_y$ denote gradient field strengths in the x and y directions, respectively. $G_E$ and $G_R$ denote a phase encoding field and a reading field, respectively.

Assuming that a time interval t is in the range of $0 \leq t \leq T_x$ and that t and $G_y$ (gradient field strength in the y direction) are variables, an observed signal F(t, $G_y$) is represented as follows:

$$F(t, G_y) = \int\int f(x, y) \cdot \exp\{i \cdot \gamma(x \cdot G_X \cdot t + y \cdot G_y \cdot T_y)\}dxdy \quad (1)$$

(where, f(x, y) represents a spatial distribution, i represents an imaginary unit and $\gamma$ represents a gyromagnetic ratio.)

When the equation (1) is deformed:

$$F(t, G_y) = \int\{\int\!\!\int f(x, y) \cdot \exp(i \cdot \gamma \cdot x \cdot G_X \cdot \qquad (2)$$
$$t)dx\}\exp(i \cdot \gamma \, y \cdot G_y \cdot T_y)dy$$

In the equation (2), the term concerning a position x has a variable t, while the term concerning a position y has a variable $G_y$. Both the terms are, however, equivalent. Therefore, as simplified, but enough explanation, the position x is selected and discussed hereafter. Then, the equation (2) is simplified for x.

$$F(t) = \int f(x) \cdot \exp(i \cdot \gamma \cdot x \cdot G_x \cdot t) dx \qquad (3)$$

In short, the equations (1), (2), and (3) demonstrate that the signal F results from Fourier transformation of an element of a spatial distribution f.

When an MR signal is observed actually, as shown in FIG. 1, only discrete sample points are observed for a finite duration. In FIG. 1, N points (i.e., $T_x = N \cdot \Delta t$) are monitored at an interval of $\Delta t$.

Figure 2:
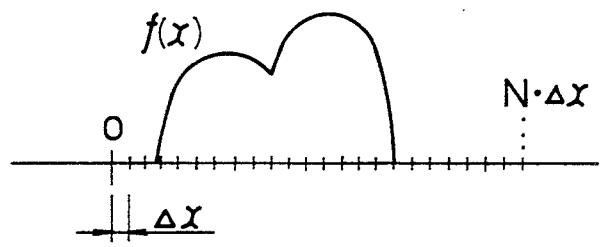
FIG. 2 shows a distribution function causing no aliasing in an observed MR signal.

Data observed at the N points are analyzed numerically to produce an image consisting of N points (one-dimensional imaging is considered for easier understanding). Assume that a pitch (spatial resolution) of a spatial distribution f(x) that should be produced is $\Delta X$. To prevent aliasing from occurring in the spatial distribution signal, as shown in FIG. 2, f(x)=0 [premise 1] must be satisfied under the condition of X<O and X>N·$\Delta X$.

An observed signal F (m ·$\Delta t$) ($0 \leq m \leq N-1$) can be expressed approximately as follows:

$$F(m \cdot \Delta t) \approx \sum_{k=0}^{N-1} f(k \cdot \Delta x)\exp\{i \cdot \gamma(k \cdot \Delta x)G_X \cdot m \cdot \Delta t\} \cdot \Delta x \qquad (4)$$
$$= \Delta x \cdot \Sigma f(k \cdot \Delta x)\exp\{i(\gamma \cdot G_X \cdot \Delta x \cdot \Delta t)k \cdot m\}$$

Herein, assuming that $\gamma \cdot G_x \cdot \Delta X \cdot \Delta t = \theta$ [premise 2], and that F (m·$\Delta t$) is abbreviated as F(m), and f (k·$\Delta X$) as f(k), the following expression is established:

$$F(m) = C \sum_{k=0}^{N-1} f(k)\exp(i \cdot \theta \cdot k \cdot m) \qquad (5)$$

(where, C is a constant.)

In the equation (5), a matrix representing transformation: that is, exp (i·$\theta$·k·m) is to be expressed as $M_\theta$.

Based on the Nyquist's theorem, a "Nyquist spatial resolution" $\Delta X_O$ corresponding to the frequency resolution $\Delta f_O$ has been shown, using a gradient field strength $G_x$, a Larmor constant $\gamma$, a time interval of observation $\Delta t$, and a number of observation points as $$\gamma \cdot G_x \cdot \Delta X_O \cdot \Delta t = 2\pi/N \qquad (6)$$

which is referred to as a "Nyquist condition".

When the "Nyquist frequency" $\Delta X_O$ is assigned to $\Delta x$ in the previous equation (4), $\theta = 2\pi/N$ ensues. Therefore, the equation (5) becomes as follows:

$$F(m) = C \sum_{k=0}^{N-1} f(k)\exp\{(2\pi/N)i \cdot k \cdot m\}. \qquad (7)$$

Thus, it is found that F(m) and f(x) compose a pair for discrete Fourier transformation (DFT).

To restore the observed signal F(m) to an element of the spatial distribution f(k), DFT is performed on F(m). To be more specific, $$f(k) = C' \sum_{m=0}^{N-1} F(m)\exp\{-(2\pi/N)i \cdot m \cdot k\} \qquad (8)$$

(where, C' is a constant.)

In the equation (7), a matrix $M_{\theta O}(\theta_O = 2\pi/N)$ representing transformation is an orthogonal matrix. A matrix for inverse transformation, $M_{\theta O}^{-1}$, is specified as $$M_{\theta O}^{-1} = CM_{-\theta O}.$$

In the aforesaid discussion, a spatial resolution $\Delta X_O$ under the conditions of an observation time $T_x$ and a field strength $G_x$ has been associated with $\theta$ that equals to $\theta_O$ (=$2\pi/N$). In this case, a matrix $M_{\theta O}$ was an orthogonal matrix. The following shows that how the matrix becomes when $\theta$ is smaller than $\theta_O$, which will lead to the essence of the present invention.

When $0 < \theta < \theta_O = 2\pi/N$ is established, a determinant $M_O$ (hereinafter referred to as $detM_{74}$) is not zero as described later. Hence, it is found that an inverse matrix of $M_\theta$, $M_\theta^{-1}$, exists.

Therefore, using the inverse matrix $M_\theta^{-1}$, a spatial distribution f(k) can be obtained from an observed signal F (m) according to the following equation (9):

$$f(k) = C \sum_{m=0}^{N-1} F(m)\{(M_\theta^{-1})m \cdot k\} \qquad (9)$$

In this case, $M_\theta$ is not an orthogonal matrix but represents a kind of Fourier transformation. This transformation is, therefore, referred to as "discrete oblique Fourier transformation (DOFT)".

Under what condition $detM_\theta$ is not zero for $\theta$ defined as $0 < \theta < \theta_O = 2\pi/N$ will be described below. $M_\theta$ that has been discussed so far is defined as $$(M_\theta)m \cdot k = (e_{i\theta})^{km}.$$

Hereafter, a more general matrix M shown below that is not restricted by $e^{i\theta}$ will be discussed for z instead of $e^{i\theta}$.

$$M = \begin{pmatrix} 1 & 1 & 1 & \ldots & 1 \\ 1 & z & z^2 & \ldots & z^{N-1} \\ \cdot & \cdot & \cdot & \ldots & \cdot \\ \cdot & \cdot & \cdot & \ldots & \cdot \\ \cdot & \cdot & \cdot & \ldots & \cdot \\ 1 & z^{n-1} & z^{n-2} & \ldots & z^{(n-1)(n-1)} \end{pmatrix}$$

This determinant is expressed as follows:

$$detM = z^{N(N-1)(N-2)/6} \prod_{k=1}^{N-1} (z^k - 1)^{N-k}$$

where, $$\prod_{k=1}^{N-1}$$

represents a product of terms ranging from k=1 to N−1. Therefore, detM=0 is limited to $z = e^{2\pi i k/K}$ (K=1,2,...,N−1, k=0,1,...,K−1). Consequently, when $z = e^{i\theta}(0 < \theta \leq 2\pi i/N)$, detM=detM$_\theta \neq 0$.

Figure 3:
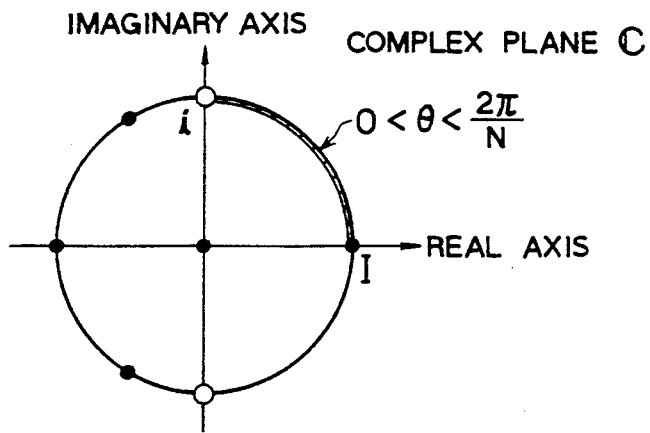
FIG. 3 represents a complex plane showing the range of a parameter $\theta$ used in the method of the present invention.

FIG. 3 shows the aforesaid relation for N=4. In a complex plane c, ● indicates a point that meets detM=0, and ○ indicates that meets $\theta = \theta_O = 2\pi/N = \pi/2$ under the Nyquist conditions. A hatched band (guardrant) corresponds to $0 < \theta < 2\pi/N$.

Back to the spatial resolution ΔX, the relation between ΔX and θ is provided as $\theta = \gamma \cdot G_x \cdot \Delta X \cdot \Delta t$ of the premise 2. In other words, ΔX and θ have a proportional relation. Since the Nyquist conditions for DFT are specified with $\theta_O$ and $\Delta X_O$, if $\theta < \theta_O$, then $\Delta X < \Delta X_O$. Consequently, the spatial resolution Δx improves.

The previous discussion will be reiterated in consideration of the premise 1.

When a domain of f(X)≠0 is contained in 0≤X≤N·ΔX, even if ΔX<ΔX$_O$, f(k·ΔX) [k=0,1,...,N−1] is obtained using an inverse matrix M$_\theta^{-1}$ of a matrix M$_\theta$ for θ that is determined by the premise 2, $\theta = \gamma \cdot G_x \cdot \Delta X \cdot \Delta t$.

When ΔX32 α·ΔX$_O$, if α<1, an image is enlarged. An inverse number of α, 1/α, is referred to as "a zooming coefficient (ZC)."

It has been assumed that the domain of f(X)≠0 resides in the range of 0≤X≤N·ΔX(ΔX=α·ΔX$_O$).

Orthogonal detection is usually adopted in MRI. From this viewpoint, x may be a negative value in the process of numerical calculation.

To handle x having a negative value, M$_\theta^{NO}$ for an adequate N$_O$ that is not 1(i.e., N$_O \neq 1$) is used as a transformation matrix on behalf of M$_\theta^{NO}$ in which N$_O$ equals to 1(i.e., N$_O$=1).

Alternatively, when a domain of f(X)≠0 is contained in −X$_1$≤X≤X$_2$ (x$_1$ and x$_2$ are positive values), if phase shift represented as $$F'(m \cdot \Delta t) = \exp\{2\pi i (x_1/N \cdot \Delta x)m\} \cdot F(m \cdot \Delta t) \quad (10)$$

is performed on F(m·Δt), the Shift theorem concerning Fourier transformation converts f'(X) corresponding to F'(m·Δt) into a function that is obtained by shifting f(x) by X$_1$ in the positive direction. Consequently, the domain of f(X)≠0 is contained in 0≤X≤X$_1$+X$_2$. Thus, similarly to the previous explanation, M$_\theta$ can be used as it is. This eliminates the necessity of using M$_{74}^{NO}$(-N$_O \neq 1$).

Figure 4:
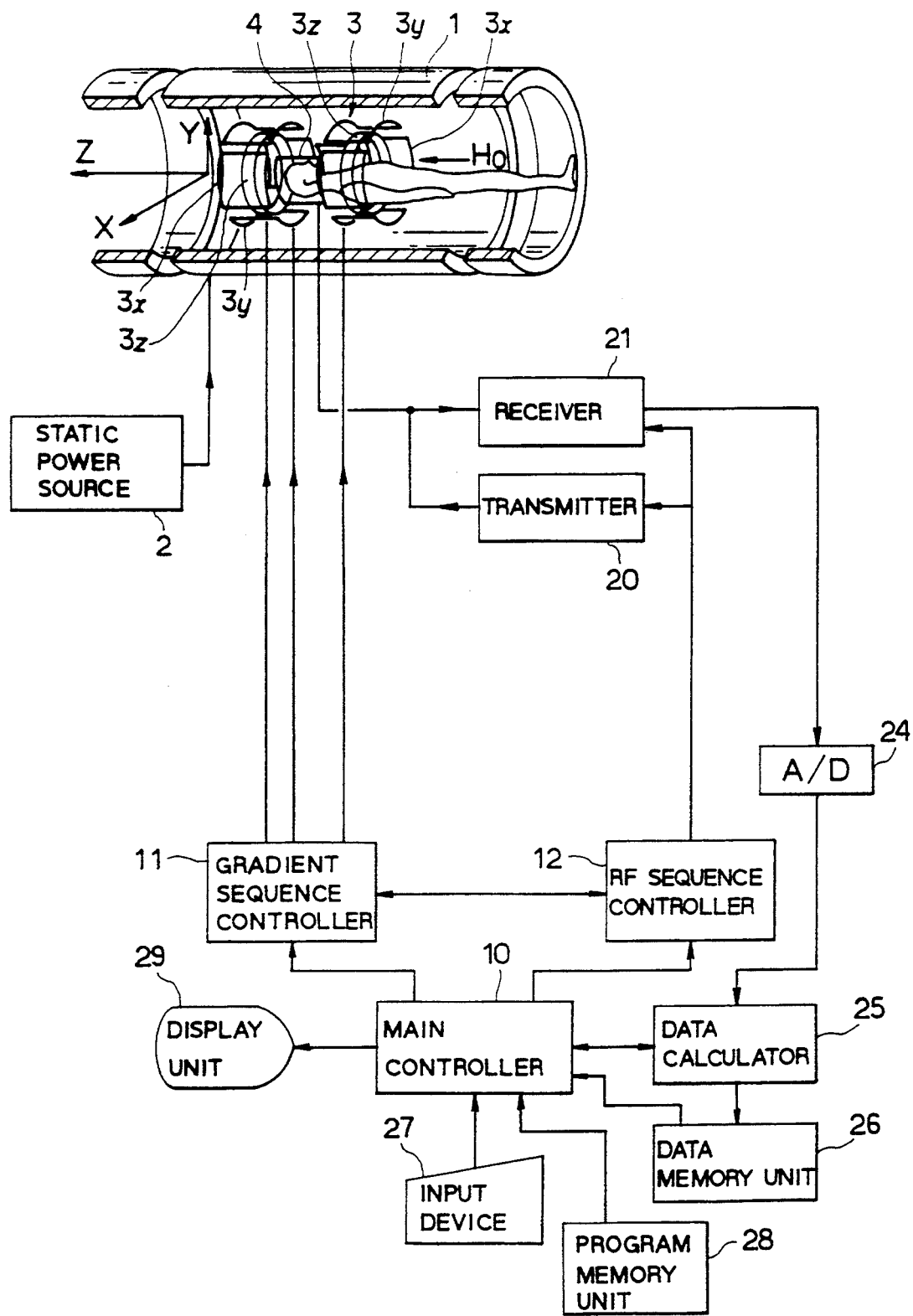
FIG. 4 illustrates in block form an MRI system of a first embodiment.

A first embodiment of the present invention will now be described according to FIGS. 4 to 8. FIG. 4 is a block diagram schematically representing a whole construction of an MRI system.

The MRI system shown in FIG. 4 comprises a magnet 1 generally formed into a cylinder shape having a hollow portion therein for placing a patient P, and a static power source 2 for supplying required electric current to the magnet 1. When the magnet 1 begins to work, a static field, having a uniform magnetic strength H$_O$ and being directed in a z-direction along the body axis of the patient P, is formed in the central diagnostic space in the hollow portion of the magnet 1.

In the hollow portion of the magnet 1, there is provided a gradient coil portion 3. The gradient coil portion 3 includes two pairs of x-coils 3x...3x for generating a field gradient in an x-direction, two pairs of y-coils 3y...3y for generating a field gradient in a Y-direction, and one pair of z-coils 3z and 3z for generating a field gradient in the z-direction.

An RF coil 4 is disposed in the inner space of the magnet 1, whereby the patient p inserted into the inner space is surrounded by the RF coil 4 and the gradient coils 3x...3z. The RF coil 4 is in charge of transmitting and receiving radio frequency(RF) magnetic pulses to and from the patient P.

The MRI system is also provided with a main controller 10 controlling the entire system, a gradient sequence controller 11 controlling the pulse sequences to the field gradients, an RF sequence controller 12 controlling the pulse sequence to the RF signal. The main controller 10 comprises a computer for entire control. The main controller 10 can send a start signal and a stop signal of the pulse sequences to the controllers 11 and 12.

The gradient sequence controller 11 is also provided with a computer which stores a program of a pulse sequence in accordance with a multi-slice and a gradient field echo process, for example. In response to the start signal from the main controller 10, the gradient sequence controller 11 is to supply pulsed currents to the x-coils 3x...3x, y-coils 3y...3y, and z-coils 3z and 3z, respectively.

As shown in FIG. 4, the RF sequence controller 12 is connected to the RF coil 4 by way of a transmitter 20 and a receiver 21. The transmitter 20 is designed to supply a radio frequency(RF) pulsed current to the RF coil 4, thus a high frequency magnetic field generated from the RF coil 4 sending to a diagnostic portion of the patient P. MR signals emitted from the diagnostic portion of the patient P can be detected by the RF coil 4 and received by the receiver 21 through control of the RF sequence controller 12. Besides, operation timing is synchronized between the controllers 12 and 11.

The received MR signals are sent, by way of an analogue to digital converter 24, to a data calculator 25 to be reconstructed therein into corresponding image data with Fourier transformation, as described later. The image data thus-reconstructed is designed to be stored in a data memory unit 26.

The main controller 10 is also connected to an input device 27, a program memory unit 28, and a display unit 29. The reconstructed image data can be supplied to the main controller 10 from the data memory unit 26 when necessary.

Figure 5:
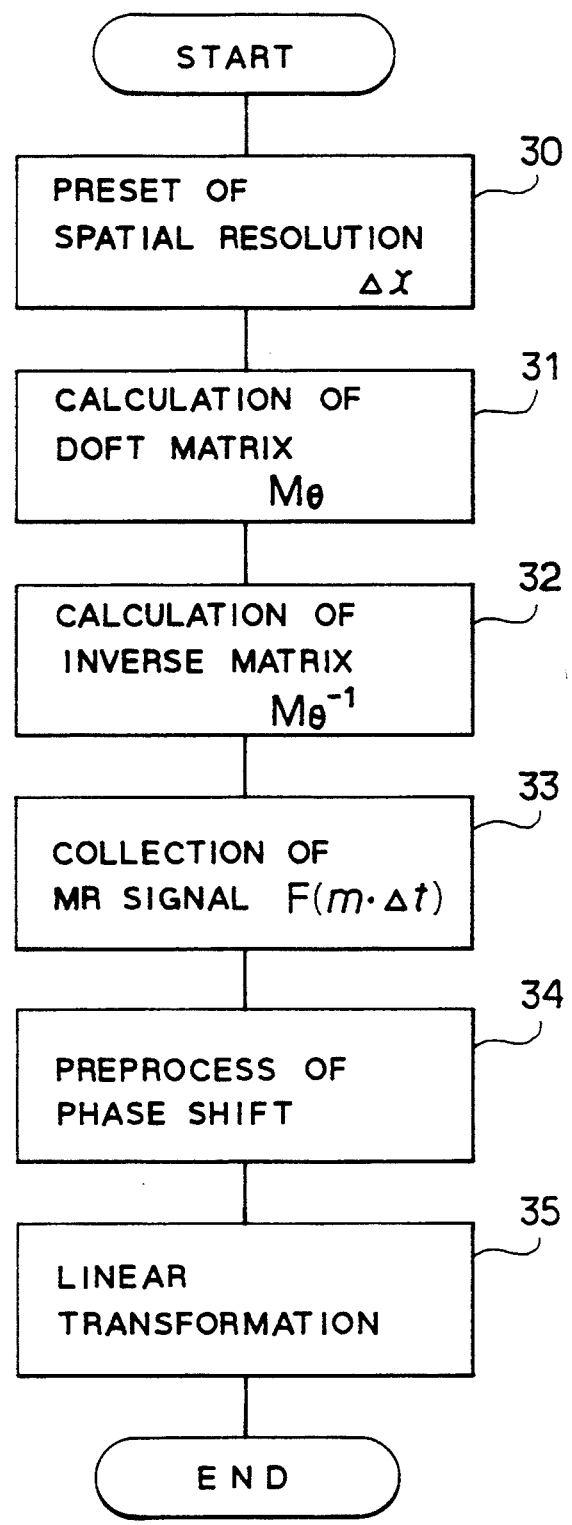
FIG. 5 represents a flowchart showing image reconstruction procedure of the first embodiment.

FIG. 5 shows a procedure of reconstructing an image which is carried by the main controller 10 and the data calculator 25.

At Step 30 in FIG. 5, a spatial resolution ΔX is preset. The preset is different among three different methods: (a) when it is already known that an object is small, (b) when the size of an object is detected by performing prescan, and (c) when observation points are increased in number.

(a) When it is already known that an object is small:

More specifically, when it is already known that an object is much smaller than a size corresponding to a frequency range determined by the Nyquist conditions, assuming that the spread of a distribution function f(X) ≠0 is α(N·ΔX) [0<α<1], ΔX is defined as ΔX +α·ΔX$_O$.

(b) When the size of an object is detected by performing prescan:

When the size of an object is unknown, MR signals are acquired according to a pulse sequence (i.e., a reading gradient field) in which phase-encoding pulses are not applied. Then, Fourier transformation is performed to provide projection data of the object. Using the projection data, the size of the object can be measured.

Figure 6:
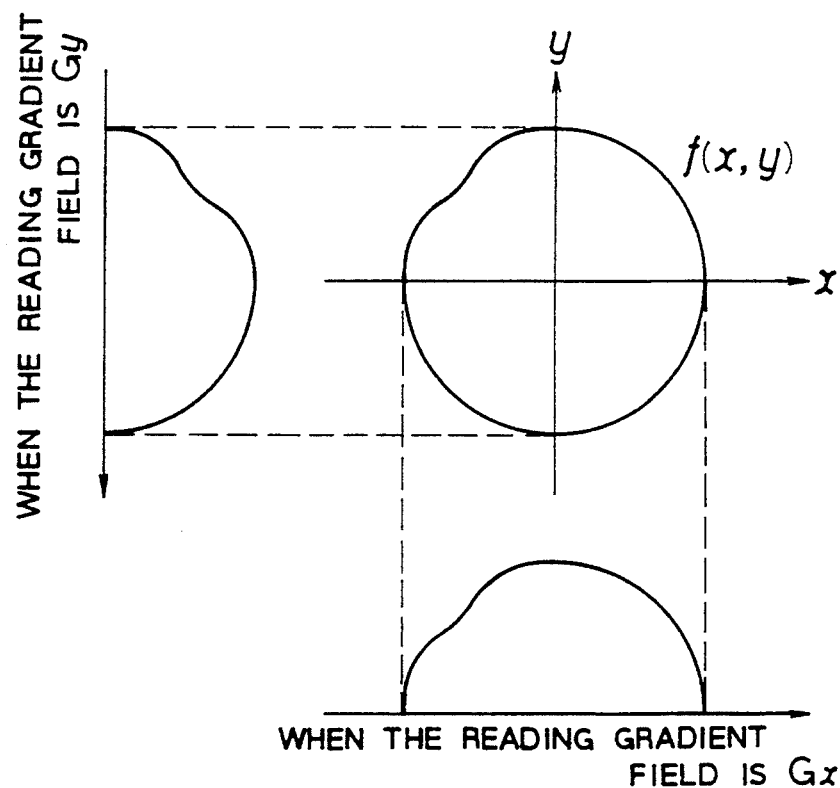
FIG. 6 shows a process in which when the size of an object is unknown, prescan is performed to measure the size.
Figure 7:
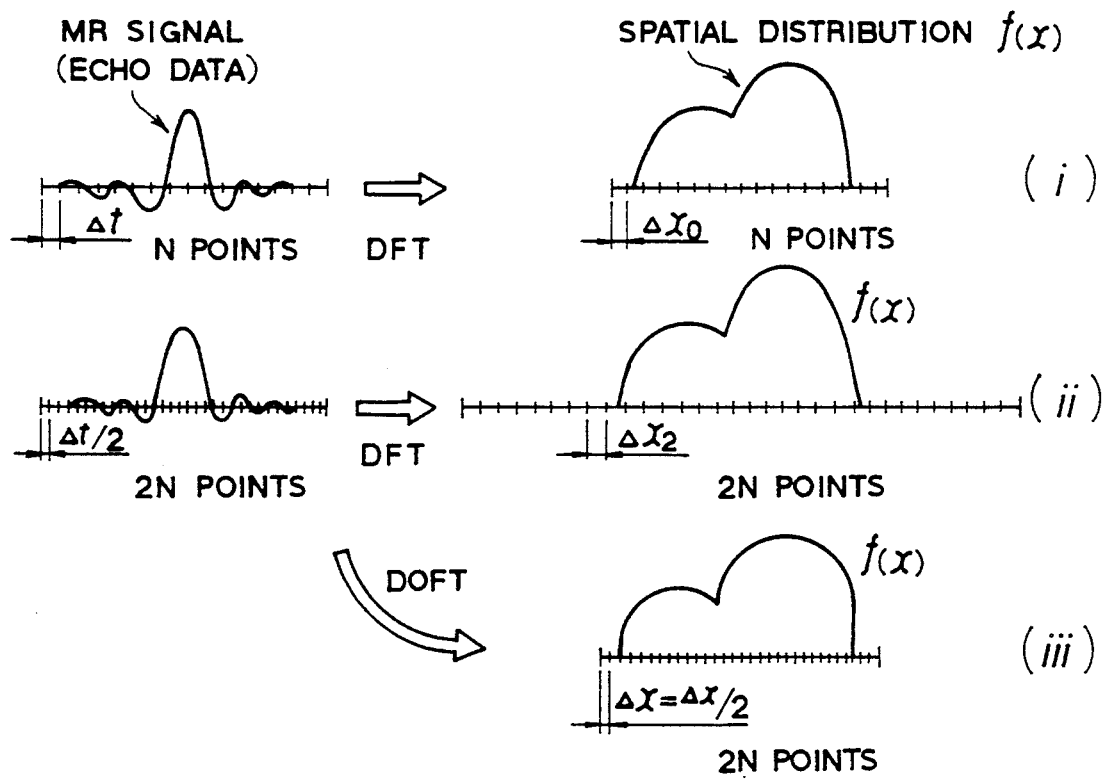
FIG. 7 shows a distribution function resulting from DOFT performed on data acquired at observation points doubled in number, together with distribution functions resulting from conventional DFT.

For instance, as shown in FIG. 6, assigning the direction of the reading gradient field to $G_x$ and $G_y$ can provide the sizes of the object in the two x and y directions. When the direction is further changed to $G_z$, the size can be measured in three directions in all. The subsequent procedure is identical to that in foregoing (a). Then, the spatial resolution $\Delta X$ is defined as $\Delta X + \alpha \cdot \Delta X_O$.

(c) When observation points are increased in number:

Instead of observing N points at an interval of $\Delta t$, more points, for example, 2N points are observed at an interval of $\Delta t/2$. In this case, a resolution $\Delta X_O$ under the Nyquist conditions remain unchanged, but its frequency band is doubled. Hence, as shown in (iii) of FIG. 7, the range of a non-zero domain in a distribution function f(X) is reduced relatively. Therefore, a spatial resolution $\Delta X$ can be preset as $\Delta X + \Delta X_O/2$ (that is $\alpha + \frac{1}{2}$, zooming coefficient is 2). Compared with the methods (a) and (b), the method (c) can be termed as a measuring method for actively improving resolution.

Completing the preset of a spatial resolution as described above, the procedure will go on to Step 31. At Step 31, a discrete oblique Fourier transformation matrix $M_\theta$ is calculated according to the preset spatial resolution $\Delta X$. Then, at Step 32, an inverse matrix $M_\theta^{-1}$ of the matrix $M_\theta$ is calculated.

At Step 33, MR signals $F(m \cdot \Delta t)$ are then collected using a 2DFT, 3DFT, or back projection method under control of the gradient sequence controller 11 and the RF sequence controller 12.

Then, at Step 34, the phase shift is carried out to produce phase-shifted MR signals $F'(m \cdot \Delta t)$ from the collected MR signals $F(m \cdot \Delta t)$ according to the foregoing equation (10). The processing of the phase shift can be avoided if $0 < X < 2\pi/N$.

At Step 35, collected MR data are then subjected to linear transformation of the inverse matrix $M_\theta^{-1}$.

More specifically, the linear transformation for MR data collected by 2DFT method can be shown in FIGS. 8A to C. The MR data collected by 2DFT method can be represented in FIG. 8A. First, discrete oblique Fourier transformation (DOFT) as a non-orthogonal Fourier transformation is performed over time t (in a first direction) to produce data corresponding to FIG. 8B. Next, discrete oblique Fourier transformation is performed over gradient field $G_y$ (in a second direction). These two-stage discrete oblique Fourier transformations provide an image illustrated in FIG. 8C.

As to the MR data collected by 3DFT method, discrete oblique Fourier transformation is further performed in a slicing direction in addition to the foregoing two-times transformation for the data by 2DFT (i.e., in this case, discrete oblique Fourier transformation will be done three times in total).

For the MR data collected by back projection, the foregoing discrete oblique Fourier transformation is performed in one direction, then known convolution back projection is carried out.

As described so far, the image reconstruction method in this embodiment can provide improved spatial resolution by merely exchanging softwares, without performing hardware renovation.

A second embodiment of the present invention will now be described according to FIG. 9.

Figure 9:
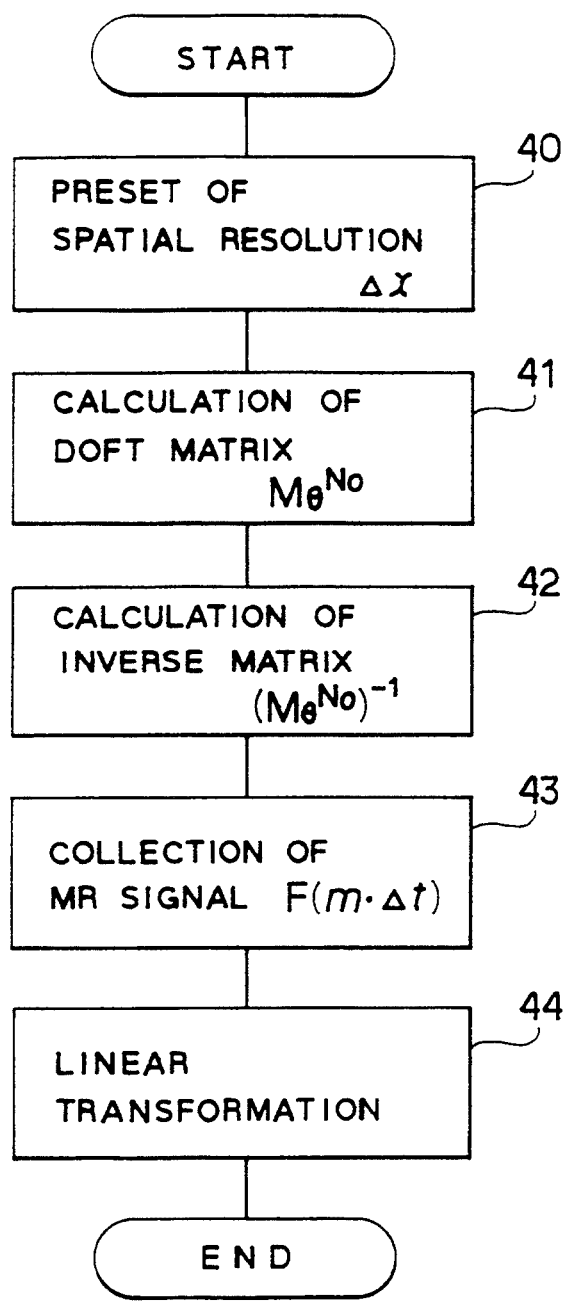
FIG. 9 represents a flowchart showing image reconstruction procedure of a second embodiment.

In the second embodiment, at Step 40 in FIG. 9, a spatial resolution $\Delta X$ is to be preset through the same fashion as described before. Then, at Step 41, a discrete oblique Fourier transformation matrix $M_\theta^{N_O}$ is calculated, and at Step 42, the calculation of the inverse matraix $(M_\theta^{N_O})^{-1}$ is followed. At Step 43, MR signals F $(m \cdot \Delta t)$ is collected, and at Step 44, the foregoing linear transformation is performed.

The procedure shown in FIG. 9 is able to eliminate the necessity for introducing the foregoing preprocess step described as Step 34 in FIG. 5. And, even if an x has a negative value, the processing for image reconstruction can be performed as it is, for right choice of $N_o$ in number.

What we claim is:

1. An image reconstruction method for magnetic resonance imaging, in which an object to be imaged is placed in a static magnetic field and gradient magnetic fields are applied to the object through gradient coils for obtaining a discrete magnetic resonance signal to reconstruct the image, the method comprising the steps of:

setting a transforming parameter in a discrete oblique Fourier transformation;

collecting the discrete magnetic resonance signal through a radio frequency coil; and reconstructing the image by applying a discrete oblique Fourier transformation with said transforming parameter to the collected discrete magnetic resonance signal.

2. The method according to claim 1, said setting step further comprising steps of:

calculating a transformation matrix for a resolution determining coefficient smaller than a further resolution determining coefficient defined with a spatial resolution under a Nyquist condition when said discrete magnetic resonance signal is observed at predetermined time intervals in a read-out gradient magnetic field of a given strength, the read-out gradient magnetic field being one of the gradient magnetic fields; and calculating an inverse transformation matrix of the calculated transformation matrix whereby said transferring parameter being said inverse transformation matrix.

3. The method according to claim 2, wherein said further resolution determining coefficient $\theta_O$ is given by $$\theta_O = 2\pi/N = \gamma \cdot G_x \cdot \Delta X_O \cdot \Delta t,$$

where N is the observed point number, $\gamma$ is a gyromagnetic ratio, $G_x$ is a strength of the gradient field in an X-direction, $\Delta X_O$ is the spatial resolution under the Nyquist condition, and $\Delta t$ is the time interval.

4. The method according to claim 3, wherein said transformation matrix $M_\theta$ for the resolution determining coefficient $\theta(<\theta_O)$ is given by $$[(M_\theta^{N_O})_{kl} = \exp\{i \cdot \theta \cdot (k - N_O)(l - N_O)\}]$$

where $N_O$ is a predetermined integer ranging from 1 to N, k=1...N, l=1...N, and i is an imaginary unit.

5. The method according to claim 4, wherein said discrete oblique Fourier transformation is given by $$f(k \cdot \Delta x) = C \sum_{m=0}^{N-1} F(m \cdot \Delta t)\{((M_\theta^{N_O})^{-1})m \cdot k\},$$

where f(k·ΔX) is a calculated spatial function, k=0,1, ..., N−1, C' is a constant, m=0,1, ..., N−1, F (m·Δt) is the collected magnetic resonance signal, and $(M_\theta^{NO})^{-1}$ is the inverse transformation matrix.

6. The method according to claim 3, wherein said transformation matrix $M_\theta$ for the resolution determining coefficient $\theta(<\theta_O)$ is given by $$M_\theta = \begin{pmatrix} 1 & 1 & 1 & \ldots & 1 \\ 1 & e^{i\theta} & e^{i2\theta} & \ldots & e^{i(N-1)\theta} \\ \cdot & \cdot & \cdot & \ldots & \cdot \\ \cdot & \cdot & \cdot & \ldots & \cdot \\ \cdot & \cdot & \cdot & \ldots & \cdot \\ 1 & e^{i(N-1)\theta} & e^{i2(N-1)\theta} & \ldots & e^{i(N-1)(N-1)\theta} \end{pmatrix},$$

where i is an imaginary unit.

7. The method according to claim 6, wherein said discrete oblique Fourier transformation is given by $$f(k \cdot \Delta x) = C' \sum_{m=0}^{N-1} F(m \cdot \Delta t)\{(M_\theta^{-1})m \cdot k\},$$

where f(k·ΔX) is a calculated spatial function, k=0,1, ..., N−1, C' is a constant, m=0,1, ..., N−1, F(m·Δt) is the collected magnetic resonance signal, and $M_\theta^{-1}$ is the inverse transformation matrix.

8. An image reconstruction method for magnetic resonance imaging, in which an object to be imaged is placed in a static magnetic field and gradient magnetic fields are applied to the object through gradient coils for obtaining a discrete magnetic resonance signal for reconstructing the image, the method comprising steps of:
    specifying a spatial resolution smaller than a further spatial resolution under a Nyquist condition derived from a Nyquist theorem;
    calculating a transformation matrix according to the specified spatial resolution;
    calculating an inverse transformation matrix of the calculated transformation matrix;
    collecting the discrete magnetic resonance signal from said object through a radio frequency coil; and
    reconstructing the image by applying a discrete oblique Fourier transformation using the inverse transformation matrix to the collected discrete magnetic resonance signal.

9. The method according to claim 8, wherein said transformation matrix calculating step determines a resolution determining coefficient corresponding to the specified spatial resolution.

10. The method according to claim 8, wherein said specifying step specifies the spatial resolution Δx given by $$\Delta x = \alpha \cdot \Delta x_o,$$

where $\alpha[0<\alpha<1]$ represents a zooming coefficient with a spread of a distribution function f(x) not equal to zero and $\Delta x_o$ is the further spatial resolution under the Nyquist condition.

11. The method according to claim 10, wherein said equation $\Delta x = \alpha \cdot \Delta x_o$ is used when a size of said object is known and is smaller than a spread of a band width defined by the Nyquist condition.

12. The method according to claim 10, wherein said equation $\Delta x = \alpha \cdot \Delta x_o$ is used when a size of said object is unknown and is obtained by scanning without phase-encoding and with a Fourier transformation.

13. The method according to claim 8, wherein said specifying step specifies the spatial resolution by increasing observation points and decreasing a time interval.

14. The method according to claim 8, wherein said reconstructing step is based on a two-dimensional Fourier transformation method and further includes two steps each performing a discrete oblique Fourier transformation.

15. The method according to claim 8, wherein said reconstructing step is based on a three-dimensional Fourier transformation method and further includes three steps each performing a discrete oblique Fourier transformation.

16. The method according to claim 8, wherein said reconstructing step is based on a back projection method and includes one step performing a discrete oblique Fourier transformation.

17. The method according to claim 8, further comprises a step of shifting a phase of said collected discrete magnetic resonance signal, prior to said reconstructing step, the phase shift being defined by a phase shift theorem in a Fourier transformation.

* * * * *

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

In column 1, line 20 "$T_r \cdot A$" to --$T_r \cdot A$-- and;

in colum 1, line 20 please change "$\Delta X_O$" to --$\Delta x_O$-- and;

in column 1, line 26 please change "$1/T_r=(\gamma \cdot G_x/2\pi) \cdot \Delta X_O$" to --$1/T_r=(\gamma \cdot G/2\pi) \cdot \Delta x_O$-- and;

in column 1, line 31 please change "$\gamma \cdot G_x \cdot \Delta X_O \cdot \Delta t = 2\pi/N$" to --$\gamma \cdot G_x \cdot \Delta x_O \cdot \Delta t = 2\pi/N$-- and;

in column 1, line 35 please change "$\Delta X$" to --$\Delta x$-- and;

in column 2, line 63 please change $$"F(t, G_y) = \iint f(x, y) \cdot \exp\{i \cdot \gamma (x \cdot G_x \cdot t + y \cdot G_y \cdot T_y)\} dxdy"$$

to $$--F(t, G_y) = \iint f(x, y) \cdot \exp\{i \cdot \gamma (x \cdot G_x \cdot t + y \cdot G_y \cdot T_y)\} dxdy--$$

and;

in column 3, line 1 please change $$"F(t, G_y) = \int \{\int f(x, y) \cdot \exp(i \cdot \gamma \cdot x \cdot G_x \cdot"$$

to $$--F(t, G_y) = \int \{\int f(x, y) \cdot \exp(i \cdot \gamma \cdot x \cdot G_x \cdot --$$

and;

UNITED STATES PATENT AND TRADEMARK OFFICE
CERTIFICATE OF CORRECTION

PATENT NO. : 5,352,981

DATED : October 4, 1994

INVENTOR(S) : Yoshio Machida

It is certified that error appears in the above-indentified patent and that said Letters Patent is hereby corrected as shown below:

in column 3, line 4 please change

"$t) dx\} \exp(i \cdot \gamma\, y \cdot G_y \cdot T_y)\, dy$"

to

--$t) dx\} \exp(i \cdot \gamma \cdot y \cdot G_y \cdot T_y)\, dy$-- and;

in column 3, line 27 please change "$\Delta X$" to --$\Delta x$-- and;

in column 3, line 30 please change "X<O" to --x<O-- and;

in column 3, line 31 please change "X>N · $\Delta X$" to --x>N · $\Delta x$-- and;

in column 3, lines 36-38, please change:

"$$F(m \cdot \Delta t) \approx \sum_{k=0}^{N-1} f(k \cdot \Delta x) \exp\{i \cdot \gamma (k \cdot \Delta x) G_x \cdot m \cdot \Delta t\} \cdot \Delta x$$

$$= \Delta x \cdot \Sigma f(K \cdot \Delta x) \exp\{i (\gamma \cdot G_x \cdot \Delta x \cdot \Delta t) k \cdot m\}$$

to

--$$F(m \cdot \Delta t) \approx \sum_{k=0}^{N-1} f(k \cdot \Delta x) \exp\{i \cdot \gamma (k \cdot \Delta x) G_x \cdot m \cdot \Delta t\} \cdot \Delta x$$

$$= \Delta x \cdot \Sigma f(K \cdot \Delta x) \exp\{i (\gamma \cdot G_x \cdot \Delta x \cdot \Delta t) k \cdot m$$-- and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 3, line 40, please change $$"\gamma \cdot G_x \cdot \Delta X \cdot \Delta t = \theta"$$

to $$--\gamma \cdot G_x \cdot \Delta x \cdot \Delta t = \theta--$$

and;

in column 3, line 41, please change "F(K·ΔX)" to --F(K·Δx)-- and;

in column 3, line 52 please change "$\Delta X_O$" to --$\Delta x_O$-- and;

in column 3 line 57, please change $$"\gamma \cdot G_x \Delta X_O \cdot \Delta t = 2\pi/N"$$

to $$--\gamma \cdot G_x \Delta x_O \cdot \Delta t = 2\pi/N--$$

and;

in column 3, line 59 please change "$\Delta X_O$" to --$\Delta x_O$-- and;

in column 4 line 6 please change $$"f(k) = C \sum_{m=0}^{N-1} F(m) \exp\{-(2\pi/N) i \cdot m \cdot k\}"$$

to

UNITED STATES PATENT AND TRADEMARK OFFICE
CERTIFICATE OF CORRECTION

PATENT NO. : 5,352,981

DATED : October 4, 1994

INVENTOR(S) : Yoshio Machida

It is certified that error appears in the above-indentified patent and that said Letters Patent is hereby corrected as shown below:

$$--f(k) = C' \sum_{m=0}^{N-1} F(m) \exp\{-(2\pi/N) i \cdot m \cdot k\} --$$

and;

in column 4, line 15 please change "$\Delta X_O$" to --$\Delta x_O$-- and;

in column 4 line 23, please change "$M_{74}$" to --$M_\theta$-- and;

in column 4 lines 32, please change $$"f(k) = C \sum_{m=0}^{N-1} F(m) \exp\{(M_\theta^{-1}) m \cdot k\}"$$

to $$--f(k) = C' \sum_{m=0}^{N-1} F(m) \exp\{(M_\theta^{-1}) m \cdot k\} --$$

and:

in column 4 line 42, please change $$"(M_\theta) m \cdot k = (e_{i\theta})^{km}"$$

to $$--(M_\theta) m \cdot k = (e^{i\theta})^{km}--$$

and;

UNITED STATES PATENT AND TRADEMARK OFFICE
CERTIFICATE OF CORRECTION

PATENT NO. : 5,352,981

DATED : October 4, 1994

INVENTOR(S) : Yoshio Machida

It is certified that error appears in the above-indentified patent and that said Letters Patent is hereby corrected as shown below:

in column 4 lines 48-55, please change $$"M = \begin{pmatrix} 1 & 1 & 1 & \cdots & 1 \\ 1 & z & z^2 & \cdots & z^{N-1} \\ \cdot & \cdot & \cdot & \cdots & \cdot \\ \cdot & \cdot & \cdot & \cdots & \cdot \\ \cdot & \cdot & \cdot & \cdots & \cdot \\ 1 & z^{n-1} & z^{n-2} & \cdots & z^{(n-1)(n-1)} \end{pmatrix}"$$

to $$--M = \begin{pmatrix} 1 & 1 & 1 & \cdots & 1 \\ 1 & z & z^2 & \cdots & z^{N-1} \\ \cdot & \cdot & \cdot & \cdots & \cdot \\ \cdot & \cdot & \cdot & \cdots & \cdot \\ \cdot & \cdot & \cdot & \cdots & \cdot \\ 1 & z^{N-1} & z^{N-2} & \cdots & z^{(N-1)(N-1)} \end{pmatrix}--$$

and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 4 line 60, please change $$\text{"}detM = z^{N(N-1)(N-2)/6} \prod_{k=1}^{N-1} (z^k - 1)^{N-k}\text{"}$$

to $$--detM = z^{N(N-1)(N-2)/6} \prod_{k=1}^{N-1} (z^k - 1)^{N-k} --$$

in column 4 lines 66-68, please change $$\text{"}\prod_{k=1}^{N-1}\text{"}$$

to $$--\prod_{k=1}^{N-1}--$$

and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 5 line 2, please change $$"Z = e^{2\pi i k/K}"$$

to $$-- Z = e^{2\pi i k/K} --$$

and;

in column 5 line 4, please change "$e^i\theta$" to --$e^{i\theta}$-- and;

in column 5 line 5, please change "c" to --C-- and;

in column 5 line 11, please change "$\Delta X$" to --$\Delta x$-- and;

in column 5 line 12, please change "$\Delta X$" to --$\Delta x$-- and;

in column 5 line 12, please change "$\theta = \gamma \cdot G_r \cdot \Delta X \cdot \Delta t$" and;

in column 5 line 13, please change "$\Delta X$" to --$\Delta x$-- and;

in column 5 line 15, please change "$\Delta X_0$" to --$\Delta x_0$-- and;

in column 5 line 16, please change "$\Delta X < \Delta X_0$" to --$\Delta x < \Delta x_0$-- and;

in column 5 line 20, please change "$f(X) \neq 0$" to --$f(x) \neq 0$-- and;

in column 5 line 20-21, please change "$O \leq X \leq N \cdot \Delta X$" to --$O \leq x \leq N \cdot \Delta x$-- and;

in column 5 line 21, please change "$\Delta X < \Delta X_0$" to --$\Delta x < \Delta x_0$-- and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 5 line 21, please change "$f(k \cdot \Delta X)$" to --$f(k \cdot \Delta x)$-- and;

in column 5 line 23, please change "$\theta$that" to --$\theta$ that-- and;

in column 5 line 24, please change "$\theta = \gamma \cdot g_x \cdot \Delta X \cdot \Delta t$" to --$\theta = \gamma \cdot g_x \cdot \Delta x \cdot \Delta t$-- and;

in colomn 5 line 25, please change "$\Delta X 32 \alpha \cdot \Delta X_O$" to --"$\Delta X = \alpha \cdot \Delta x_O$-- and;

in column 5 line 28, please change "$f(X) \neq 0$" to --$f(x) \neq 0$-- and;

in column 5 line 29, please change "$0 \leq X \leq N \cdot \Delta X (\Delta X = \alpha \cdot \Delta X_O$" to --$0 \leq x \leq N \cdot \Delta x (\Delta x = \alpha \cdot \Delta x_O$-- and;

in column 5 line 33, please change

"$M_\theta^{NO}$"

to

--$M_\theta^{N_O}$-- and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 5 line 38, please change "$-X_1 \leq X \leq X_2$" to $--x_1 \leq x \leq x_2--$ in column 5 line 41, please change $$" F(m \cdot \Delta t) = \exp\{2\pi i (x_1/N \cdot \Delta x) m\} \cdot F(m \cdot \Delta t)'"$$

to $$--F'(m \cdot \Delta t) = \exp\{2\pi i (x_1/N \cdot \Delta x) m\} \cdot F(m \cdot \Delta t)'--$$

and;

in column 5 line 46, please change "$X_1$" to $--x_1--$ and;

in column 5 line 47, please change "$f(X) \neq 0$" to $--f(x) \neq 0--$ and;

in column 5 line 47, please change "$0 \leq X \leq X_1 + X_2$" to $--0 \leq x \leq x_1 + x_2--$ in column 5 line 49, please change $$"M_{74}^{NO}(-N_O \neq 1)"$$

to $$--M_6^{NO}(-N_O \neq 1)--$$

and;

in column 6 line 52, please change "$\Delta X$" to $--\Delta x--$ and;

in column 6 lines 62-63, please change "$f(X) \neq O$" to $--f(x) \neq O--$ and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 6 line 63, please change "$\alpha(N \cdot \Delta X)$" to --$\alpha(N \cdot \Delta x)$-- and;

in column 6 line 63, please change "$\Delta X$" to --$\Delta x$-- and;

in column 6 line 63, please change "$\Delta X + \alpha \cdot \Delta X_0$" to --$\Delta x = \alpha \cdot \Delta x_0$-- and;

in column 7 line 11, please change "$\Delta X$" to --$\Delta x$-- and;

in column 7 line 12, please change "$\Delta X + \alpha \cdot \Delta X_0$" to --$\Delta x = \alpha \cdot \Delta x_0$-- and;

in column 7 line 16, please change "$\Delta X_0$" to --$\Delta x_0$-- and;

in column 7 line 20, please change "$f(X)$" to --$f(x)$-- and;

in column 7 line 21, please change "$\Delta X$" to --$\Delta x$-- and;

in column 7 line 21, please change "$\Delta X + \Delta X_0/2$" to --$\Delta x = \Delta x_0/2$-- and;

in column 7 line 21, please change "$\alpha + \frac{1}{2}$" to --$\alpha = \frac{1}{2}$-- and;

in column 7 line 29, please change "$\Delta X$" to --$\Delta x$-- and;

in column 7 line 39, please change "$0 < X < x\pi/N$" to --$0 < x < x\pi/N$-- and;

in column 8 line 2, please change "$\Delta X$" to --$\Delta x$-- and;

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

in column 8 line 49, please change $$"\theta_O = 2\pi/N = \gamma \cdot G_x \Delta X_O \cdot \Delta t"$$

to $$--\theta_O = 2\pi/N = \gamma \cdot G_x \Delta x_O \cdot \Delta t--$$

and;

in column 8 line 53, please change "$\Delta X_O$" to --$\Delta x_O$-- and;

in column 8 line 59, please change $$"[(M_\theta^{NO})_{kl} = \exp\{i \cdot \theta \cdot (K-N_O)(l-N_O)\}]"$$

to $$--[(M_\theta^{NO})_{kl} = \exp\{i \cdot \theta \cdot (K-N_O)(l-N_O)\}]--$$

and;

in column 8 line 62, please change "l=1 . . . N" to --l=1 . . . N-- and;

in column 8 line 66, please change $$"f(k \cdot \Delta x) = C \sum_{m-0}^{N-1} F(m \cdot \Delta t) \{((M_\theta^{NO})^{-1})m \cdot k\}"$$

to $$--f(k \cdot \Delta x) = C' \sum_{m-0}^{N-1} F(m \cdot \Delta t) \{((M_\theta^{NO})^{-1})m \cdot k\} --$$

UNITED STATES PATENT AND TRADEMARK OFFICE
CERTIFICATE OF CORRECTION

PATENT NO. : 5,352,981
DATED : October 4, 1994
INVENTOR(S) : Yoshio Machida

It is certified that error appears in the above-indentified patent and that said Letters Patent is hereby corrected as shown below:

and;

in column 9 line 1, please change "f(k·ΔX)" to --f(k·Δx)-- and;

in column 9 line 1, please change "$(M_\theta^{No})^{-1}$" to --$(M_\theta^{No})^{-1}$-- and;

in column 9 line 23, please change $$"f(k \cdot \Delta x) = C \sum_{m=0}^{N-1} F(m \cdot \Delta t) \{ (M_\theta^{-1}) m \cdot k \}"$$

to $$--f(k \cdot \Delta x) = C' \sum_{m=0}^{N-1} F(m \cdot \Delta t) \{ (M_\theta^{-1}) m \cdot k \} --$$

Signed and Sealed this

Third Day of September, 1996

Attest:

BRUCE LEHMAN

*Attesting Officer*     *Commissioner of Patents and Trademarks*